US012237331B2

(12) United States Patent
Cho et al.

(10) Patent No.: US 12,237,331 B2
(45) Date of Patent: Feb. 25, 2025

(54) CMOS LOGIC ELEMENT INCLUDING OXIDE SEMICONDUCTOR

(71) Applicant: Electronics and Telecommunications Research Institute, Daejeon (KR)

(72) Inventors: Sung Haeng Cho, Daejeon (KR); Byung-Do Yang, Daejeon (KR); Sooji Nam, Daejeon (KR); Jaehyun Moon, Daejeon (KR); Jae-Eun Pi, Daejeon (KR); Jae-Min Kim, Cheongju-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 602 days.

(21) Appl. No.: 17/520,853

(22) Filed: Nov. 8, 2021

(65) Prior Publication Data

US 2023/0097393 A1 Mar. 30, 2023

(30) Foreign Application Priority Data

Sep. 24, 2021 (KR) .................. 10-2021-0126684

(51) Int. Cl.
*H01L 27/02* (2006.01)
*H01L 27/092* (2006.01)
(Continued)

(52) U.S. Cl.
CPC ........ *H01L 27/092* (2013.01); *H01L 27/0207* (2013.01); *H01L 29/24* (2013.01); *H03K 19/018521* (2013.01); *H03K 19/0948* (2013.01)

(58) Field of Classification Search
CPC ... H01L 27/092; H01L 27/0207; H01L 29/24; H03K 19/018521; H03K 19/0948
(Continued)

(56) References Cited

U.S. PATENT DOCUMENTS 6,808,971 B2 10/2004 Bhattacharyya
6,888,386 B2 * 5/2005 Peng .................... H03L 7/0895
327/148
(Continued)

FOREIGN PATENT DOCUMENTS

JP 2013-161878 A 8/2013
JP 2014-3184 A 1/2014
(Continued)

OTHER PUBLICATIONS

Son, Youngbae, et al. "Monolithic integration of high-voltage thin-film electronics on low-voltage integrated circuits using a solution process" *Nature Electronics vol. 2* Nov. 2019 pp. 540-548.
(Continued)

*Primary Examiner* — Monica D Harrison
(74) *Attorney, Agent, or Firm* — NSIP Law

(57) ABSTRACT

Provided is a Complementary Metal Oxide Semiconductor (CMOS) logic element. The CMOS logic element includes a substrate including a PMOS area, a circuit wiring structure including an insulating layer and a wiring layer alternately stacked on the substrate, wherein the circuit wiring structure includes an NMOS area vertically spaced apart from the PMOS area, a first transistor disposed on the PMOS area, and a second transistor disposed on the NMOS area and complementarily connected to the first transistor, wherein the first transistor includes a first gate electrode, source/drain areas formed on the PMOS area on both sides of the first gate electrode, and a first channel connecting the source and drain areas to each other, wherein the second transistor includes a second gate electrode and a second channel vertically overlapping the second gate electrode, wherein the first channel includes silicon, wherein the second channel includes an oxide semiconductor.

8 Claims, 5 Drawing Sheets

(51) Int. Cl.
*H01L 29/24* (2006.01)
*H03K 19/018* (2006.01)
*H03K 19/0185* (2006.01)
*H03K 19/0948* (2006.01)

(58) Field of Classification Search
USPC .......................................................... 257/43
See application file for complete search history.

(56) References Cited

U.S. PATENT DOCUMENTS

| | | | |
|---|---|---|---|
| 9,219,005 B2 * | 12/2015 | Or-Bach | ................ H10B 12/09 |
| 9,508,742 B2 * | 11/2016 | Yamazaki | ........... H01L 27/1225 |
| 10,290,908 B2 | 5/2019 | Momo et al. | |
| 10,692,935 B2 | 6/2020 | Kwon et al. | |
| 2011/0089417 A1 | 4/2011 | Yamazaki et al. | |
| 2013/0200363 A1 | 8/2013 | Sunamura et al. | |
| 2015/0102419 A1 | 4/2015 | Ikeda et al. | |

FOREIGN PATENT DOCUMENTS

| | | |
|---|---|---|
| JP | 2015-167227 A | 9/2015 |
| JP | 7099762 B1 | 7/2022 |
| KR | 10-2017-0078373 A | 7/2017 |
| KR | 10-2017-0094559 A | 8/2017 |
| KR | 10-2018-0072880 A | 6/2018 |

OTHER PUBLICATIONS

Korean Office Action issued on Nov. 28, 2024, in counterpart Korean Patent Application No. 10-2021-0126684 (7 pages in English, 7 pages in Korean).

* cited by examiner

CMOS LOGIC ELEMENT INCLUDING OXIDE SEMICONDUCTOR

CROSS-REFERENCE TO RELATED APPLICATIONS

This U.S. non-provisional patent application claims priority under 35 U.S.C. § 119 of Korean Patent Application No. 10-2021-0126684, filed on Sep. 24, 2021, the entire contents of which are hereby incorporated by reference.

BACKGROUND

The inventive concept relates to a Complementary Metal Oxide Semiconductor (CMOS) logic device including an oxide semiconductor.

Metal oxide semiconductor field effect transistors are often referred to as MOSFETs, and are semiconductors in which only one polarity of carriers (electrons or holes) is involved in the internal electrical conduction process within the semiconductors, and are also called unipolar transistors. The principle of operation of the FET is characterized in that the conductivity and electrical resistance of the semiconductor crystal are controlled by an electric field, and the input impedance is very high compared to the general transistor, so that unlike a general bipolar transistor, practically little control current flows and an active role such as signal amplification and switching is performed through the control voltage.

These MOSFETs have the advantage of being easy to integrate in addition to the advantage of control without loss of output, so that the MOSFETs are used in a fairly large proportion in the semiconductor industry, which requires very precise scaling.

A complementary metal oxide semiconductor (CMOS) inverter is a signal processing element used in digital logic circuits, and the like, and is generally formed by connecting a p-type MOSFET (PMOS) element and an n-type MOSFET (NMOS) element.

SUMMARY

The present disclosure is to reduce a required layout area and implement a CMOS logic element that enables high-speed operation.

The inventive concept is also to reduce the power consumption of the CMOS logic element by reducing the leakage current.

An embodiment of the inventive concept provides a Complementary Metal Oxide Semiconductor (CMOS) logic element including: a substrate including a PMOS area; a circuit wiring structure including an insulating layer and a wiring layer alternately stacked on the substrate, wherein the circuit wiring structure includes an NMOS area vertically spaced apart from the PMOS area; a first transistor disposed on the PMOS area; and a second transistor disposed on the NMOS area and complementarily connected to the first transistor, wherein the first transistor includes a first gate electrode, source/drain areas formed on the PMOS area on both sides of the first gate electrode, and a first channel connecting the source and drain areas to each other, wherein the second transistor includes a second gate electrode and a second channel vertically overlapping the second gate electrode, wherein the first channel includes silicon, and wherein the second channel includes an oxide semiconductor.

In an embodiment, the oxide semiconductor may include at least one of In, Ga, Zn, Sn, K, Al, Ti, and W.

In an embodiment, the oxide semiconductor may be $InMO_3(ZnO)_m$ (m≥0), where m includes any one or more of metal elements selected from Gallium (Ga), tin (Sn), potassium (K), aluminum (Al), iron (Fe), nickel (Ni), manganese (Mn), and cobalt (Co).

In an embodiment, the first transistor and the second transistor may constitute an inverter.

In an embodiment, each of the first gate electrode and the second gate electrode may include at least one of a conductive metal nitride and a metal.

In an embodiment, a CMOS logic element includes: a first transistor connected between a power node and an output node and operating in response to an input signal; and a second transistor connected between a ground node and an output node and operating in response to the input signal, wherein the first transistor and the second transistor are located at different levels, wherein at least one of the first transistor and the second transistor is implemented as an oxide semiconductor.

In an embodiment, the oxide semiconductor may include at least one of In, Ga, Zn, Sn, K, Al, Ti, and W.

In an embodiment, the oxide semiconductor may be $InMO_3(ZnO)_m$ (m≥0), where m includes any one or more of metal elements selected from Gallium (Ga), tin (Sn), potassium (K), aluminum (Al), iron (Fe), nickel (Ni), manganese (Mn), and cobalt (Co).

In an embodiment, the first transistor may be an NMOS transistor, wherein the second transistor may be a PMOS transistor.

In an embodiment, the first transistor may be a PMOS transistor, wherein the second transistor may be an NMOS transistor.

In an embodiment, the first transistor may be complementarily connected to the second transistor through a wiring layer connected vertically.

In an embodiment, the oxide semiconductor may be patterned in an island shape.

In an embodiment of the inventive concept, a CMOS logic element includes: a substrate; first and second transistors disposed in a first area over the substrate; a circuit wiring structure including an insulating layer and a wiring layer alternately stacked on the substrate, wherein the circuit wiring structure has a second area vertically spaced apart from the substrate; and a third transistor and a fourth transistor provided in the second area, wherein two of the first to fourth transistors are one of an NMOS transistor and a PMOS transistor, and the other two of the first to fourth transistors are the other one of the NMOS transistor and the PMOS transistor, wherein two of the first to fourth transistors include a channel including any one of a silicon and an oxide semiconductor, and the other two of the first to fourth transistors include a channel including the other one of silicon and oxide semiconductor, wherein the first transistor and the second transistor are transistors of the same type, and the third transistor and the fourth transistor are transistors of the same type.

In an embodiment, the oxide semiconductor may include at least one of In, Ga, Zn, Sn, K, Al, Ti, and W.

In an embodiment, the oxide semiconductor may be $InMO_3(ZnO)_m$ (m≥0), where m includes any one or more of metal elements selected from Gallium (Ga), tin (Sn), potassium (K), aluminum (Al), iron (Fe), nickel (Ni), manganese (Mn), and cobalt (Co).

In an embodiment, the first transistor may be connected between a power node and an output node and operate in response to a first input signal, wherein the second transistor may be connected between the power node and the output node and operate in response to a second input signal, wherein the third transistor may be connected between the ground node and the intermediate node and operate in response to the first input signal, wherein the fourth transistor may be connected between the intermediate node and the output node and operate in response to the second input signal, wherein a first channel of the first transistor and a second channel of the second transistor may be implemented with silicon, wherein a third channel of the third transistor and a fourth channel of the fourth transistor may be implemented with an oxide semiconductor.

In an embodiment, the first and second transistors may be PMOS transistors, wherein the third and fourth transistors may be NMOS transistors.

In an embodiment, the first and second transistors may be NMOS transistors, wherein the third and fourth transistors may be PMOS transistors.

In an embodiment, the first and second transistors may be complementarily connected to the third and fourth transistors through the wiring layer stacked vertically.

In an embodiment, the first and second transistors may be disposed on the same layer, wherein the third and fourth transistors may be disposed on the same layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In order to fully understand the configuration and effects of the inventive concept, preferred embodiments of the inventive concept will be described in detail with reference to the accompanying drawings. The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, the components are shown to be enlarged in size for convenience of description, and the ratio of each component may be exaggerated or reduced.

In addition, terms used in the present specification may be interpreted as meanings commonly known to those of ordinary skill in the art, unless otherwise defined. Hereinafter, the inventive concept will be described in detail by describing embodiments of the inventive concept with reference to the accompanying drawings.

Figure 1A:
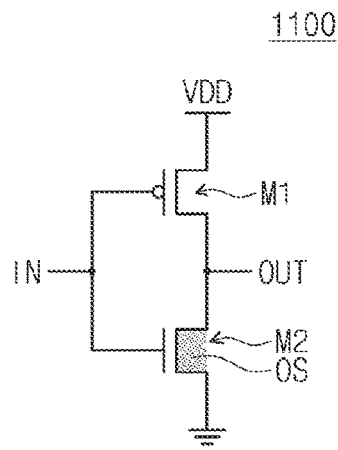
FIG. 1A is a circuit diagram of a Complementary Metal Oxide Semiconductor (CMOS) logic element according to some embodiments of the inventive concept.

FIG. 1A is a circuit diagram of a Complementary Metal Oxide Semiconductor (CMOS) logic element according to some embodiments of the inventive concept. Specifically, an inverter circuit (NOT gate) of a CMOS logic element is shown in the drawing. A first transistor M1 and a second transistor M2 may be provided. The first transistor M1 may be a PMOS, and the second transistor M2 may be an NMOS. Each gate of the PMOS and the NMOS is commonly connected to the input terminal IN, and the source of the PMOS is connected to the power supply terminal VDD. The drain of the PMOS is connected to the output terminal OUT in common with the drain of the NMOS, and the source of the NMOS is connected to the ground terminal.

At this time, when an input signal input voltage is received from the input terminal IN, it is simultaneously applied to each PMOS and NMOS as a gate voltage of each transistor. Since the characteristics of PMOS and NMOS are reversed when voltage is applied, when one side is turned on according to the applied input voltage, the other side is turned off. They are called CMOS elements because PMOS and NMOS complement each other and operate as turn-on and turn-off.

According to the inventive concept, at least one of PMOS and NMOS may include an oxide semiconductor OS. As illustrated as an example, the NMOS may include an oxide semiconductor OS. In particular, PMOS and NMOS have a vertical stacked structure, which will be described with reference to FIG. 1B.

Figure 1B:
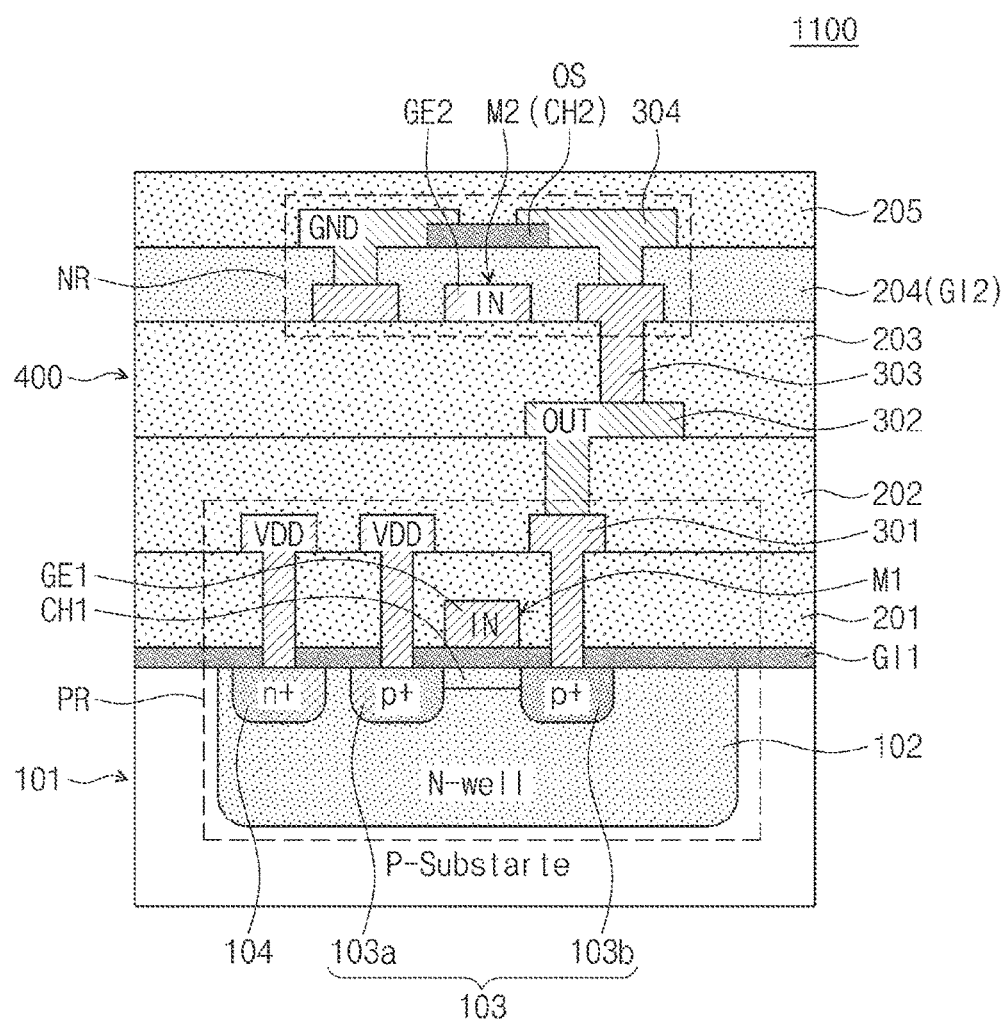
FIG. 1B is a diagram illustrating a cross-sectional view of the CMOS logic element of FIG. 1A.

Referring to FIG. 1B, a CMOS logic element 1100 according to an embodiment of the inventive concept may include a substrate 101 and a circuit wiring structure 400. The circuit wiring structure 400 may have a structure in which interlayer insulating layers 201, 202, 203, and 204 and wiring layers 301, 302, 303, and 304 are alternately stacked.

The substrate 101 may be a silicon substrate doped with a first conductivity type, a germanium substrate, or a silicon on insulator (SOI). For example, the first conductivity type may be a p-type. The circuit wiring structure 400 may further include a protective layer 205 on the uppermost portion. The interlayer insulating layers 201, 202, 203, and 204 may include a silicon oxide layer, a silicon nitride layer, or an insulating layer including an organic material such as carbon. The wiring layers 301, 302, 303, and 304 may include a conductive metal.

The first transistor M1 may be provided on the substrate 101. The second transistors M2 may be provided in the circuit wiring structure 400. The second transistor M2 may be positioned above the first transistor M1. That is, the first and second transistors M1 and M2 may have a vertically spaced structure.

A first area PR may be provided on the substrate 101. The first area PR may be, for example, a PMOS area PR. The PMOS area PR may be an active area in which the first transistor M1 is provided. A well 102 doped with the second conductivity type may be formed on the PMOS area PR. The first transistor M1 may be positioned on the well 102.

The first transistor M1 may include a first gate GE1, source/drain areas 103a and 103b formed on both sides of the first gate GE1, and a first channel CH1 connecting the source/drain areas 103a and 103b.

A first gate insulating layer GI1 may be interposed between the first gate GE1 and the substrate 101. Each of the first gates GE1 may include a conductive metal nitride and/or a metal. For example, the first gate GE1 and the second gate GE2 may each include a metal nitride such as TiN, WN, and TaN, and a metal such as Ti, W or Ta. The first gate insulating layer GI1 may include at least one of a silicon oxide film, a silicon nitride film, a silicon oxynitride film, or a high dielectric film. The high-k film may have a higher dielectric constant than a silicon oxide film, such as a hafnium oxide film (HfO), a zirconium oxide film (ZrO), a hafnium zirconium oxide film (HfZrO), an aluminum oxide film (AlO), or a tantalum oxide film (TaO).

The circuit wiring structure 400 may include a second area NR. The second area NR is also referred to as an NMOS area NR. The NMOS area NR may be located above the PMOS area PR.

The NMOS area NR may be an active area in which the second transistor M2 is provided. The second transistor M2 will be described later.

A first interlayer insulating layer 201, a first wiring layer 301, a second interlayer insulating layer 202, a second wiring layer 302, and a third interlayer insulating layer 203 may be sequentially stacked on the first transistor on M1. Depending on the wiring design, the number of layers may be reduced or increased. The first wiring layer 301 may penetrate the first interlayer insulating layer 201, and the second wiring layer 302 may penetrate the second interlayer insulating layer 202 and be connected to the first wiring layer 301.

A fourth interlayer insulating layer 204 covering the third wiring layer 303 may be provided. The fourth interlayer insulating layer 204 may be a second gate insulating film GI2. According to some embodiments, the fourth interlayer insulating layer 204 may include the same material as the first gate insulating film GIL An oxide semiconductor OS may be provided on the fourth interlayer insulating layer. The oxide semiconductor OS may have, for example, an island shape patterned.

The oxide semiconductor OS may be formed of, for example, ZnO or $SnO_2$ based materials, and specifically, may be formed of IGZO (In—Ga—Zn—O), IGZTO (In—Ga—Zn—Sn—O), IGTO (In—Ga—Sn—O), or the like. IGZO may be formed in the form of $a(In_2O_3)$, $.b(Ga_2O_3)$, or $.c(ZnO)$. In addition, the oxide semiconductor OS may include some metal materials such as Al, W, Ti, and K.

In a typical Metal Oxide Semiconductor FET (MOSFET), when the minority carrier is inverted, the channel made of the oxide semiconductor OS opens, but as in the inventive concept, in a case using a channel made of an oxide semiconductor OS, when a majority carrier is accumulated in the oxide semiconductor OS, the channel is opened, and the channel is closed when the majority carrier is in a depleted state.

The oxide semiconductor OS may be formed through a deposition process and a patterning process. The deposition process may be, for example, a sputtering process. The patterning process may be, for example, an etching process using a mask.

A fourth wiring layer 304 penetrating the fourth interlayer insulating layer 204 and connected to the third wiring layer 303 may be provided on the fourth interlayer insulating layer 204. The fourth wiring layer 304 may be connected to both sides of the oxide semiconductor OS to function as a source/drain electrode.

The second transistor M2 may include a second gate GE2, source/drain electrodes on both sides of the second gate GE2, and a second channel CH2 connecting the source/drain electrodes. The second channel CH2 may be implemented as an oxide semiconductor OS.

A protective film 207 covering the fourth wiring layer 304 and the oxide semiconductor OS may be provided.

A semiconductor chip is formed including various types of semiconductor circuit elements, and among them, a large number of CMOS inverter elements are formed. These CMOS inverter elements are generally formed across the surface of a silicon substrate in a horizontal direction.

In particular, the layout area may be increased by the area of the N-well and the area of the P-well on the silicon substrate. In the case of using a plurality of logic elements, the N-well and the P-well are formed on the same layer, resulting in a large layout area.

However, the CMOS inverter element formed in the horizontal direction requires a large layout area, and the connection line of the signals is long, resulting in a delay in signal transmission. Accordingly, the size of the semiconductor chip also increases, which causes difficulties in developing high-speed circuits. Therefore, it is required to develop a CMOS inverter element capable of reducing the required layout area and shortening the connection length between circuits as much as possible to enable high-speed operation.

As described above, in the inventive concept, the silicon-based first transistor M1 and the oxide semiconductor-based second transistor M2 are vertically stacked. In the PMOS area PR and the NMOS area NR, wiring layers are arranged at different levels, and signals and voltages are transmitted as shown in FIG. 1A, thereby operating the CMOS inverter.

According to the inventive concept, as having the shape of a vertical CMOS inverter, it may be possible to make a CMOS inverter smaller than the circuit area (layout area) of a CMOS inverter based on a silicon transistor made on a single substrate. In addition, as using an oxide semiconductor, circuit power consumption may be significantly reduced compared to silicon-based CMOS using the very low leakage current of less than $10^{-15}$ A/um of oxide semiconductor.

Figure 2:
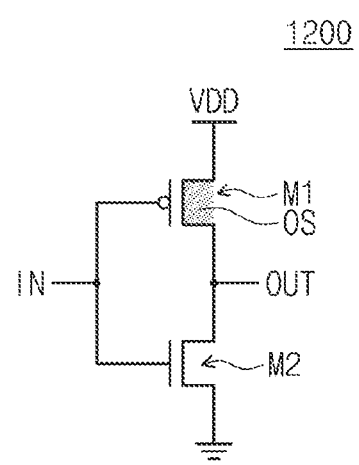
FIG. 2 illustrates a circuit diagram of a CMOS logic element in accordance with some embodiments.

FIG. 2 illustrates a circuit diagram of a CMOS element according to some embodiments. Except for those described below, since they overlap with those described in FIG. 1A, they will be omitted.

Referring to FIG. 2, the CMOS logic element 1200 according to some embodiments may include a first transistor M1 including an oxide semiconductor OS as a channel and a second transistor M2 including silicon as a channel.

When the circuit diagram as shown in FIG. 2 is implemented as in a cross-sectional view shown in FIG. 1B, it may be advantageous in terms of processes that the second transistor M2 is disposed on the substrate and the first transistor M1 is disposed on the circuit wiring structure. That is, it may be advantageous in terms of processes that the silicon channel is formed on the same layer as the substrate and the oxide semiconductor is formed through a deposition process.

For example, the NMOS area NR may be disposed on the substrate, and the PMOS area PR may be disposed in the circuit wiring structure 400.

Figure 3A:
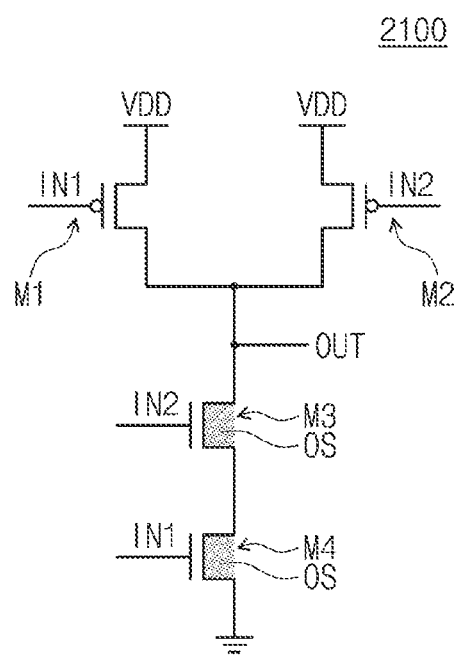
FIG. 3A illustrates a circuit diagram of a CMOS logic element in accordance with some embodiments.

FIG. 3A illustrates a circuit diagram of a CMOS element according to some embodiments. Specifically, the 2-input Nand gate circuit of the CMOS logic element 2100 is shown in the drawing.

The CMOS logic element 2100 may include a first transistor M1, a second transistor M2, a third transistor M3, and a fourth transistor M4. The first transistor M1 and the second transistor M2 may be transistors of the same type, and the third transistor M3 and the fourth transistor M4 may be other same type transistors. Specifically, a first transistor M1, a second transistor M2, a third transistor M3, and a fourth transistor M4 may be provided. The first transistor M1 and the second transistor M2 may be PMOS, and the third transistor M3 and the fourth transistor M4 may be NMOS.

Gates of the first transistor M1 and the second transistor M2 are connected to the first input terminal IN1 and the second input terminal IN2, respectively.

Each of a first terminal of the first transistor M1 and a first terminal of the second transistor M2 is connected to a power supply terminal VDD. The second terminal of the first transistor M1 and the second terminal of the second transistor M2 are each connected to the output terminal OUT.

The gate of the third transistor M3 is connected to the second input terminal IN2. A first terminal of the third transistor M3 is connected to an output terminal, and a second terminal is connected to an intermediate terminal. The gate of the fourth transistor M4 is connected to the first input terminal IN1. A first terminal of the fourth transistor M4 is connected to the intermediate terminal, and a second terminal is connected to the ground terminal.

At this time, when the input signal input voltage is received from the first input terminal IN1, it is simultaneously applied to the first transistor M1 and the fourth transistor M4. When an input voltage is input from the second input terminal IN2, it is simultaneously applied to the second transistor M2 and the third transistor M3. Since the characteristics of PMOS and NMOS are reversed when voltage is applied, when one side is turned on according to the applied input voltage, the other side is turned off.

According to the inventive concept, at least one of PMOS and NMOS may include an oxide semiconductor OS. As illustrated as an example, the NMOS may include an oxide semiconductor OS. In particular, PMOS and NMOS have a vertical stacked structure, which will be described with reference to FIG. 3B.

Figure 3B:
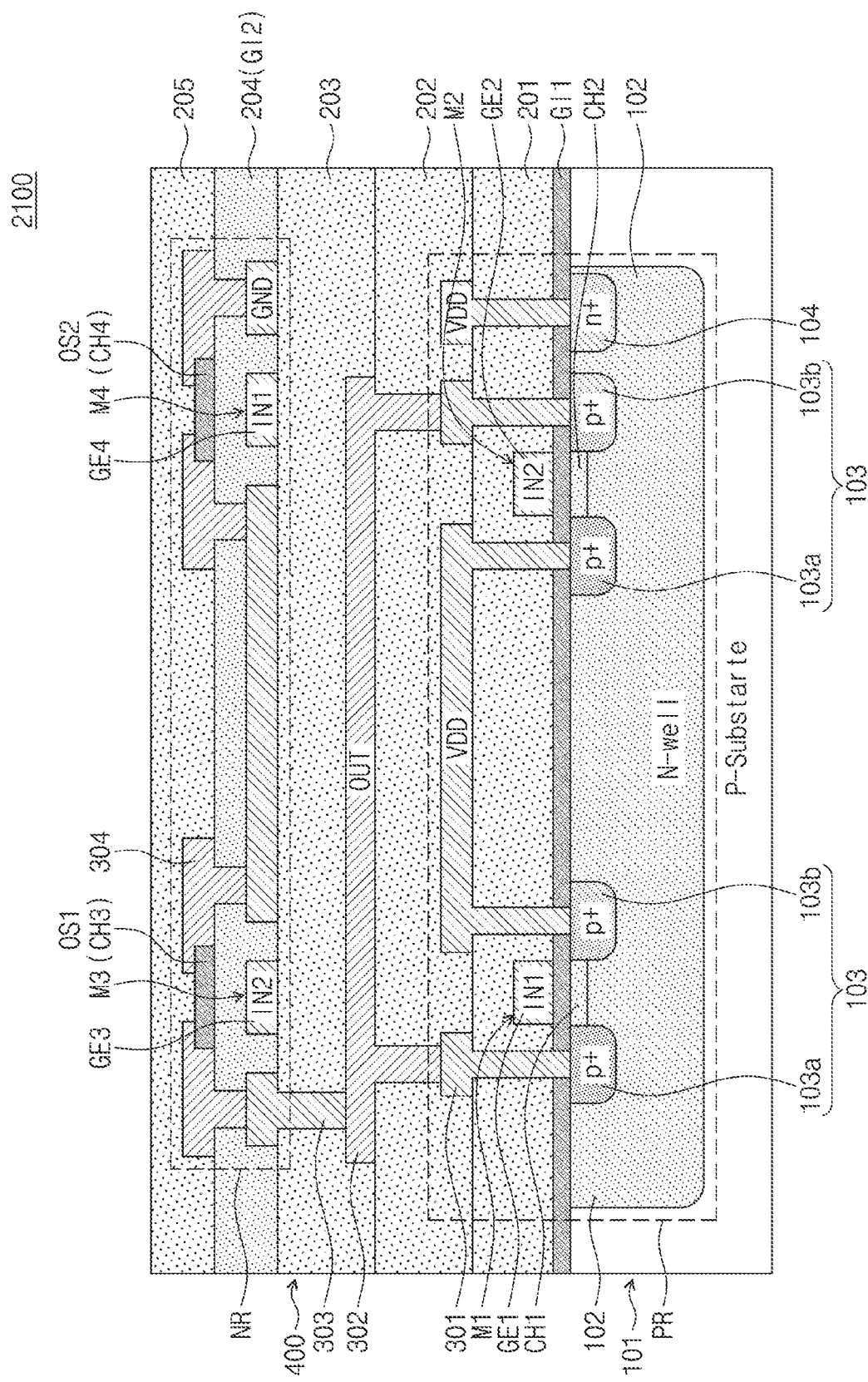
FIG. 3B is a diagram illustrating a cross-sectional view of the CMOS logic element of FIG. 3A.

FIG. 3B is a diagram illustrating a cross-sectional view of the CMOS logic element of FIG. 3A. Except for those described below, those overlapping with those described in FIG. 1B will be omitted.

Referring to FIG. 3B, a CMOS logic element 2100 according to an embodiment of the inventive concept may include a first transistor M1 and second transistors M2 disposed on the substrate 101, and a third transistor M3 and a fourth transistor M4 disposed thereon. That is, the third and fourth transistors M3 and M4 may have a structure vertically spaced apart from the first and second transistors M1 and M2.

The first and second transistors M1 and M2 may be disposed on the same layer, and the third and fourth transistors M3 and M4 may be disposed on the same layer.

A first area PR may be provided on the substrate 101. The first area PR may be, for example, a PMOS area PR. A well 102 doped with the second conductivity type may be formed on the PMOS area PR. A first transistor M1 and a second transistor M2 may be positioned on the well 102.

The first transistor M1 may include a first gate GE1, source/drain areas 103a and 103b formed on both sides of the first gate GE1, and a first channel CH1 connecting the source/drain areas 103a and 103b.

The second transistor M2 may include a second gate GE2, source/drain areas 103a and 103b formed on both sides of the second gate GE2, and a second channel CH2 connecting the source/drain areas 103a and 103b.

The third transistor M3 may include a third gate GE3, source/drain electrodes on both sides of the third gate GE3, and a third channel CH3 connecting the source/drain electrodes. The third channel CH3 may be implemented with the first oxide semiconductor OS1.

The fourth transistor M4 may include a fourth gate GE4, source/drain electrodes on both sides of the fourth gate GE4, and a fourth channel CH4 connecting the source/drain electrodes. The fourth channel CH4 may be implemented with the second oxide semiconductor OS2.

That is, even in the case of the CMOS logic element 2100 having a CMOS NAND gate circuit, the structure of the vertical stacked transistor and the transistors having a complementary connection relationship may include different channel materials.

Figure 4:
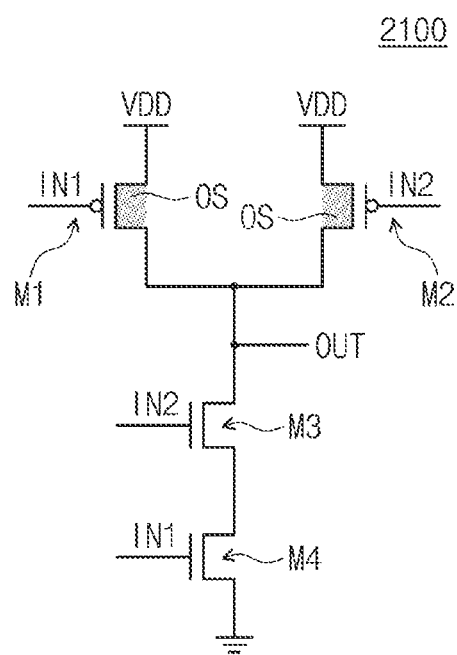
FIG. 4 illustrates a circuit diagram of a CMOS logic element in accordance with some embodiments.

FIG. 4 illustrates a circuit diagram of a CMOS element according to some embodiments. Except for those described below, since they overlap with those described in FIG. 1A, they will be omitted.

Referring to FIG. 4, a CMOS logic element 1200 according to some embodiments may include first and second transistors M1 and M2 including an oxide semiconductor OS as a channel. In addition, third and fourth transistors M3 and M4 including silicon as a channel may be included.

When the circuit diagram as shown in FIG. 4 is implemented as a cross-sectional view as shown in FIG. 1B, it may be advantageous in terms of processes that the third and fourth transistors M3 and M4 are disposed on the substrate and the first and second transistors M1 and M2 are disposed on the circuit wiring structure. That is, it may be advantageous in terms of processes that the silicon channel is formed on the same layer as the substrate and the oxide semiconductor is formed through a deposition process.

For example, the NMOS area NR may be disposed on the substrate, and the PMOS area PR may be disposed in the circuit wiring structure 400.

As the CMOS logic element according to the inventive concept has the shape of a vertical CMOS inverter, it may be possible to make a CMOS inverter smaller than the circuit area (layout area) of a CMOS inverter based on a silicon transistor made on a single substrate. In addition, as using an oxide semiconductor, circuit power consumption may be significantly reduced compared to silicon-based CMOS using the very low leakage current of less than $10^{-15}$ A/um of oxide semiconductor.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A Complementary Metal Oxide Semiconductor (CMOS) logic element comprising:
  a substrate;
  first and second transistors disposed in a first area over the substrate;
  a circuit wiring structure including an insulating layer and a wiring layer alternately stacked on the substrate, wherein the circuit wiring structure has a second area vertically spaced apart from the substrate; and
  a third transistor and a fourth transistor provided in the second area,
  wherein two of the first to fourth transistors are one of an NMOS transistor and a PMOS transistor, and the other two of the first to fourth transistors are the other one of the NMOS transistor and the PMOS transistor,
  wherein two of the first to fourth transistors include a channel including any one of a silicon and an oxide semiconductor, and the other two of the first to fourth transistors comprise a channel including the other one of silicon and oxide semiconductor, wherein the first transistor and the second transistor are transistors of the same type, and the third transistor and the fourth transistor are transistors of the same type.

2. The CMOS logic element of claim 1, wherein the oxide semiconductor comprises at least one of In, Ga, Zn, Sn, K, Al, Ti, and W.

3. The CMOS logic element of claim 1, wherein the oxide semiconductor is $InMO_3(ZnO)_m$ (m≥0), where m comprises any one or more of metal elements selected from Gallium (Ga), tin (Sn), potassium (K), aluminum (Al), iron (Fe), nickel (Ni), manganese (Mn), and cobalt (Co).

4. The CMOS logic element of claim 1, wherein the first transistor is connected between a power node and an output node and operates in response to a first input signal, wherein the second transistor is connected between the power node and the output node and operates in response to a second input signal, wherein the third transistor is connected between the ground node and the intermediate node and operates in response to the first input signal, wherein the fourth transistor is connected between the intermediate node and the output node and operates in response to the second input signal, wherein a first channel of the first transistor and a second channel of the second transistor are implemented with silicon, wherein a third channel of the third transistor and a fourth channel of the fourth transistor are implemented with an oxide semiconductor.

5. The CMOS logic element of claim 1, wherein the first and second transistors are PMOS transistors, wherein the third and fourth transistors are NMOS transistors.

6. The CMOS logic element of claim 1, wherein the first and second transistors are NMOS transistors, wherein the third and fourth transistors are PMOS transistors.

7. The CMOS logic element of claim 1, wherein the first and second transistors are complementarily connected to the third and fourth transistors through the wiring layer stacked vertically.

8. The CMOS logic element of claim 1, wherein the first and second transistors are disposed on the same layer, wherein the third and fourth transistors are disposed on the same layer.

* * * * *